United States Patent [19]
van der Groen et al.

[11] Patent Number: 6,093,577
[45] Date of Patent: Jul. 25, 2000

[54] LOW TEMPERATURE ADHESION BONDING METHOD FOR COMPOSITE SUBSTRATES

[75] Inventors: Sonja van der Groen, Kontich; Kris Baert, Leuven, both of Belgium

[73] Assignee: IMEC vzw, Leuven, Belgium

[21] Appl. No.: 08/902,993

[22] Filed: Jul. 30, 1997

[30] Foreign Application Priority Data

Jun. 16, 1997 [EP] European Pat. Off. ............. 97109769

[51] Int. Cl.[7] ........................... H01L 21/00; H01L 21/30; H01L 21/44; H01L 21/48

[52] U.S. Cl. ........................... 438/30; 438/118; 438/457; 438/459

[58] Field of Search .................. 438/118, 455, 438/457, 459, 119, 30

[56] References Cited

U.S. PATENT DOCUMENTS

| | | | |
|---|---|---|---|
| 4,338,151 | 7/1982 | Hutter, III | 156/344 |
| 5,478,782 | 12/1995 | Satoh et al. | 438/455 |
| 5,674,758 | 10/1997 | McCarthy | 438/26 |
| 5,702,963 | 12/1997 | Vu et al. | 148/DIG. 135 |
| 5,812,232 | 9/1998 | Shiroto et al. | 349/157 |

*Primary Examiner*—Brian Dutton
*Attorney, Agent, or Firm*—McDonnell Boehnen Hulbert & Berghoff

[57] ABSTRACT

A method of bonding a first substrate (10) to a second substrate (30) is described, comprising the steps of: coating an adhesive (28) onto a first major surface of said first substrate (10); aligning said first and second substrates (10, 30) so that said coated first major surface of said first substrate (10) is facing said second substrate (30) and is separated therefrom by a gap (47); deflecting at least one of said first and second substrates (10, 30) by exerting a pressure between said first and second substrates (10, 30) substantially at the center thereof so that the adhesive coating (28) substantially at the center of said first substrate (10) comes into contact with said second substrate (30); and allowing the remaining parts of said adhesive coated first major surface of said first substrate (10) to come into contact with said second substrate (30). Use of the method to produce composites, in particular transmissive liquid crystal display panels is also described.

19 Claims, 5 Drawing Sheets

LOW TEMPERATURE ADHESION BONDING METHOD FOR COMPOSITE SUBSTRATES

BACKGROUND OF THE INVENTION

1. Field of the Invention

The present invention relates to a method of bonding a first substrate to a substantially equally sized second substrate. The method is particularly useful for bonding a large size semiconductor wafer having individually complete active devices to a support substrate. The method is also particularly advantageous for bonding a first substrate including at least a thin monocrystalline layer to a transparent substrate and then thinning the first substrate thus improving the optical properties thereof. Further, the method may advantageously be used for production of composites such as active matrix liquid crystal displays or microgap chambers for medical imaging. The invention also includes composites manufactured by the method in accordance with the present invention.

2. Technical Background

Flat panel displays have been extensively used for the screens of lap-top computers and projection devices. The search for an optimal flat panel display continues. For instance, there are continuous efforts to develop panels which are larger in size, lower in energy consumption, more compact, brighter and have higher resolution. Compact, bright, very high resolution panels find application in head-mounted and projection displays. The demand for high resolution liquid crystal displays (LCD) has resulted in efforts to develop an active matrix LCD (AMLCD) with integrated drivers.

Monocrystalline silicon would allow high resolutions with integrated drivers as well as additional functionality on the same chip and would allow standard CMOS processing. The low leakage current of monocrystalline transistors allows minimal transistor size and hence high resolution. Amorphous or polycrystalline silicon layers would be easier to fabricate but they have inferior electronic properties such as low mobility and high leakage currents. These properties limit the reduction in size of the transistors and hence the resolution of the LCD display.

The disadvantage with monocrystalline silicon is its inferior optical transparency. A very thin layer of monocrystalline silicon improves the transparency but its low mechanical strength means that it is preferably supported by a transparent substrate such as glass. Methods of transferring a thin top layer of silicon are known from U.S. Pat. No. 5,206,749 in which a large area semiconductor film is separated from a first substrate and then mounted on a glass substrate. The technique is complex, in particular it is necessary to support the film at all times which requires refined methods of providing and then removing multiple supporting elements. Modifications of this technique are described in U.S. Pat. Nos. 5,256,562 and 5,258,325. In '562 and '325, circuits are formed on a silicon wafer which is diced into tiles. Each tile is separated from the underlying substrate and transferred individually to a common module body and attached using a curing adhesive. The silicon substrate of the transferred tile is etched to reduce its thickness. Hence complex, multi-function circuitry is formed on a common module body using circuit tiles of silicon thin films which are separated from a first substrate, transferred to the common module body and then interconnected and packaged. This procedure is complex and time consuming. However, as only small pieces of film are transferred, the support problems of '749 are partially solved.

Various techniques for bonding a substrate to another substrate such as glass plates are known. Some materials for low temperature bonding have been suggested by D. E. Booth and C. E. Hunt in the article "Low temperature adhesion bonding methods", Electrochemical Society Proceedings, vol. 95-7, pages 201 to 211. In this article, a method is described for bonding two similar substrates, e.g. microscope slides using various adhesives. The reported chemical tests indicate that among the materials tested curing epoxy bonding films had good survival rate in cleaning, etching and lithography chemicals. No tests on semiconductor substrates are reported, but a speculative application in CCD displays is indicated. It is proposed to illuminate the CCD device from the rear so that the epoxy film is not part of the optical circuit. Because two identical substrates are proposed, e.g. two silicon wafers, the method does not lend itself easily to chemical etching as the etching chemicals would affect both substrates equally. Instead, mechanical thinning of one substrate is proposed which, however, places high loads on the substrate/bonding material interface. Epoxy films have poorer optical properties than two-part epoxy but have about 50% higher overlap shear strength.

It is an object of the present invention to provide a method of fabricating a composite including two substrates and a bonding material between them having improved optical properties.

It is a further object of the invention to provide a method of manufacture of optical devices including two substrates, in which at least one of the substrates is a semiconductor substrate processed by CMOS technology.

It is still a further object of the present invention to provide a method suitable for manufacturing large size composite structures including a semiconductor substrate containing individually completed active devices and circuits which is relatively simple to perform, is economical and is highly reliable.

It is a further object of the invention to provide a transmissive liquid crystal display and a method for producing the same.

SUMMARY OF THE INVENTION

The present invention may provide a method of bonding a first substrate to a second substrate, comprising the steps of:

coating an adhesive onto a first major surface of said first substrate;

aligning said first and second substrates so that said coated first major surface of said first substrate is facing said second substrate and separated by a gap;

deflecting at least one of said first and second substrates by exerting a pressure between said first and second substrates substantially at the center thereof so that the adhesive coating substantially at the center of said first substrate comes into contact with said second substrate; and allowing the remaining parts of said coated first major surface of said first substrate to come into contact with said second substrate.

The method according to the present invention may further comprise the step of evacuating the gap between said coated first substrate and said second substrate before said deflecting step.

Further, the step of degassing said adhesive under reduced pressure may be included before said coating step.

The adhesive coating is preferably cured at a temperature below 200° C. after said allowing step.

The present invention has the advantage that complex circuitry can be transferred in a one step process to a substrate to produce devices of excellent electrical and optical properties.

The present invention may also provide a composite including first and second substrates bonded by an adhesive layer and manufactured in accordance with the method according to the present invention.

Preferably, at least one of said first and second substrates is a semiconductor substrate.

The composite may form the circuit panel of an LCD device or part of a microgap chamber for medical imaging.

The present invention may provide a method of fabricating a circuit panel for a liquid crystal display comprising the steps of:

forming a first composite from a layer of essentially monocrystalline silicon material on an insulating layer, the insulating layer being over a first substrate;

forming an array of transistors in or on the layer of essentially monocrystalline silicon and forming pixel electrodes such that each pixel electrode is actuatable by at least one transistor of said array;

bonding the major surface of said first composite remote from said first substrate to a second substrate to form a second composite including at least said first substrate, said insulating layer, said essentially monocrystalline silicon and said second substrate; and reducing the thickness of said first substrate.

The panel is preferably completed by positioning a liquid crystal material adjacent said insulating layer such that an electric field generated at said at least one pixel electrode alters a light transmitting property of said liquid crystal material.

Preferably, the insulating layer is selectively etched to expose a substantial area of at least one said pixel electrode bounded by said insulating layer.

The insulating layer and the opposing surface of a further clear substrate may be coated with an alignment film or orientation layer which preferably planarises and seals the surface of the insulating layer and exposed pixel electrodes. After coating of the alignment film, it is preferably baked and then rubbed.

The present invention also includes a transmissive liquid crystal display comprising:

an optically transparent substrate positioned to receive light from a light source;

a circuit panel comprising a thin film of essentially monocrystalline silicon from which an array of transistors and at least one peripheral driver circuit is formed, and pixel electrodes, each pixel electrode being electrically connected to one of the transistors and the at least one peripheral driver circuit being connected to each transistor, said circuit panel also including an insulating layer located over said thin film of essentially monocrystalline silicon;

an adhesive layer bonding the major surface of said circuit panel remote from said insulating layer to the optically transparent substrate such that the optically transparent substrate is positioned between the circuit panel and the light incident from said light source;

an area of each said pixel electrode being exposed through, and bounded, by said insulating layer;

a liquid crystal material positioned adjacent said exposed areas of said pixel electrodes such that an electric field generated at at least one said pixel electrode alters a light transmitting property of said liquid crystal material.

The present invention may provide an efficient and economical way to join to substrates in a substantially permanent way.

Further, the present invention may provide an economical and reliable manufacturing method for a transmissive liquid crystal display as all the processing of the active devices may be carried out at one time and then the completed circuits transferred in a single step process.

The dependent claims define further embodiments of the present invention. The illustrative embodiments of the present will now be described with reference to the following drawings.

DESCRIPTION OF THE PREFERRED EMBODIMENTS

Figure 1:
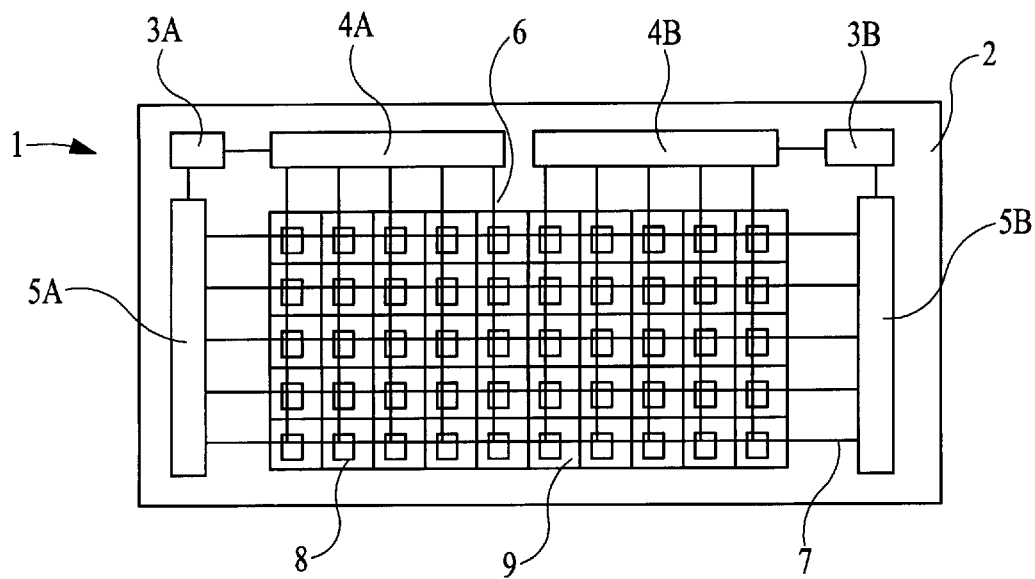
FIG. 1 is a schematic diagram of an LCD circuit panel which can be fabricated in accordance with the present invention.

In the following the present invention will be described with reference to particular embodiments and to the drawings but the invention is not limited thereto but only by the claims. In the drawings certain dimensions, particularly thicknesses, may have been exaggerated for clarity purposes. The present invention will be described with reference to an LCD but the invention is not limited thereto. The present invention will also be described with reference to a monocrystalline silicon substrate but the invention is not limited thereto. The present invention may also be applied to generally to a composite of substrates. Further the present invention may be applied to other semiconductor substrates, such as gallium arsenide.

In accordance with the present invention, complex multifunction circuitry can be formed on a substrate with good optical properties. FIG. 1 is a schematic drawing of a circuit panel 1 which is part of an AMLCD which may be fabricated in accordance with the present invention. Circuit panel 1 comprises a transparent, preferably optically clear substrate 2, onto which are transferred control logic circuits 3A, 3B and drive circuits 4A, 4B and 5A, 5B. Peripheral circuits 3, 4, 5 may contain active devices such as transistors as well as passive devices such as resistors and capacitors. Conductive connection lines 6, 7 are used to address the pixel electrodes 8 of pixels 9 of the AMLCD using the respective peripheral drive circuits 4, 5.

Figure 2:
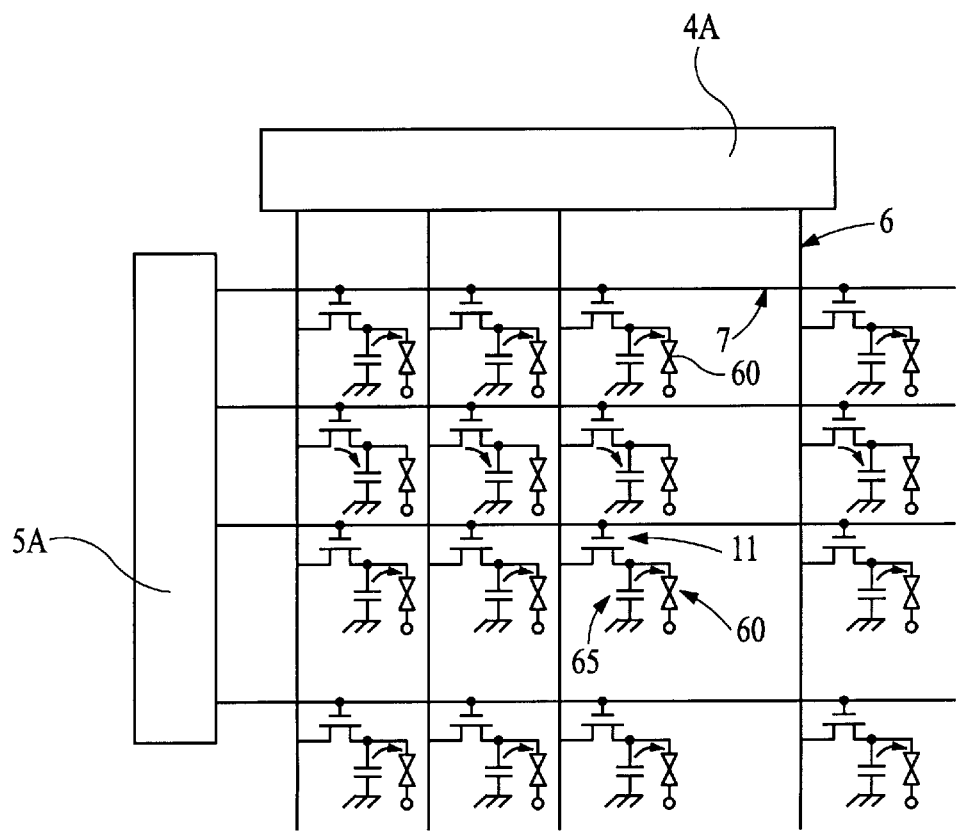
FIG. 2 is a circuit diagram of a driver system of an LCD panel in accordance with FIG. 1.

As shown in the circuit diagram of FIG. 2, at the junction of connection lines 6, 7, in a pixel 9, the connection 6 is connected to the gate and the connection 7 to the drain of a pixel transistor, e.g. a thin-film transistor 11 and the source of this transistor is connected to the pixel electrode 8. The pixel electrodes 8 may be made from polysilicon, preferably doped polysilicon or any other transparent electrode material compatible with CMOS processing.

The pixel electrode 8 of a pixel 9 is addressed by driving its pixel transistor 11 into the on state by activation of the respective connection 6 on the Y axis from drive circuits 4 or 5 and connection 7 on the X axis from drive circuits 4, 5 as determined by the control logic circuits 3A and 3B. An electric field generated at the pixel electrode alters a optical transmission property of a liquid crystal material 60 in a manner which is known to the skilled person. Capacitor 65 connected between the source of pixel transistor 11 and the source potential maintains the charge on the liquid crystal material 60 until the pixel transistor 11 is addressed again by the peripheral drive circuits 4, 5 in the next cycle. In accordance with the present invention the peripheral circuits 3, 4, 5 and the connections 6, 7 and the pixel transistors 11 are preferably pre-fabricated in a thin, preferably transparent semiconductor layer such as essentially monocrystalline silicon before being transferred to a further substrate as described in the following. The conductive connection lines 6, 7 connected to the gate of the addressing transistor 11 may be made from polysilicon, preferably doped polysilicon or any transparent conductive material compatible with CMOS processing. It is preferred if the connection line 6, 7 which is connected to the drain or source of the addressing transistor 11 is made of a metal as the currents flowing in the drain or source are considerably higher than the currents in the gate. As a metal line is impervious to light it is preferred if the metal lines 6, 7 to the drain or source are located so that they do not obstruct the light coming to or leaving the area of the liquid crystal material activated by a pixel electrode 8 when addressed.

Figure 3:
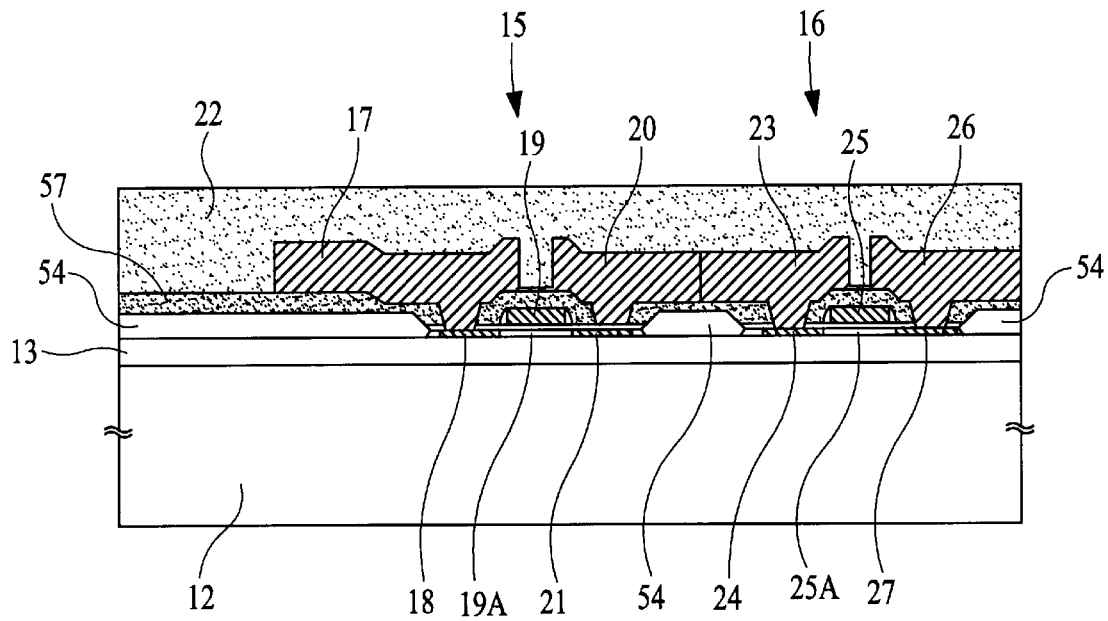
FIG. 3 is a schematic cross-sectional representation of active devices formed on a thin semiconductor layer in accordance with the present invention.

FIG. 3 is a schematic cross-sectional diagram of individually completed active devices 15, 16 fabricated in a thin film of monocrystalline silicon 14 of a silicon wafer 10. For example, active devices 15, 16 may form part of peripheral driver circuits 4, 5 or the peripheral logic circuits 3. Individually completed active devices in accordance with the present application are active devices such as transistors which have been manufactured to a point that the devices can function although certain finishing operations such as contacting the electrodes may still be done later. In accordance with the present invention a wafer may include a thin, essentially monocrystalline silicon layer 14 on a silicon base layer 12 or any insulator such as glass or sapphire or may be a large sized semiconductor essentially monocrystalline substrate suitable for the production of many thousands of active devices on one wafer. A wafer 10 in accordance with the present invention is distinguished over the tiles of U.S. Pat. Nos. 5,256,562 and 5,258,325 in that a tile is produced from a wafer by dicing. Hence, a wafer is considerably larger than a tile. It is not considered that the size of the wafer will materially affect or limit the present invention. Wafer 10 may include a relatively thick base layer 12 of silicon, for example from 200 micron to 1 mm, preferably 400 to 700 micron, on top of which an optional thin layer 13 may be provided. Thin layer 13 may be silicon oxide, silicon oxy-nitride, germanium silicon or similar. It is preferable if layer 13 is made of insulating material. Thin layer 13 may include more than one functional layer, e.g. in addition to an oxide layer as an etch stop it may include a buffer layer or selectively etchable layer as disclosed for instance in U.S. Pat. No. 5,258,325. The thin layer 13 may preferably have a thickness between 0.1 and 0.6, more preferably, 0.2 to 0.4 micron. Thin layer 13 may later be used as an etch stop when thinning the base layer 12. Alternatively, thin layer 13 may be any other material which allows a monocrystalline layer to be formed thereon, e.g. by growth or recrystallization. Above the thin layer 13, which is typically a silicon oxide layer, the layer 14 of essentially monocrystalline silicon is provided. For the purposes of the present application the term "essentially monocrystalline" means a film in which a majority of crystals show a common crystalline orientation and extend over a cross-sectional area in a plane of the film for at least 0.1 cm$^2$ and preferably in the range 0.5 to 1.0 cm$^2$ or more. Most preferably the monocrystalline layer 14 is a single crystal. Any number of techniques may be used to form a thin film 14 of essentially monocrystalline silicon. For instance, wafer 10 may be a 200 mm diameter SOI (silicon-on-insulator) or SIMOX wafer or larger. SOI and SIMOX wafers are described in the article "Properties of SIMOX and bonded SOI material", by Gösele, Reiche and Tong, Microelectronics Engineering, vol. 28 (1995) pages 391–397. SIMOX wafers can be obtained from SOITEC, Grenoble, France. It is not expected that the size of the wafer 10 will be a hindrance to carrying out the method in accordance with the present invention. Essentially monocrystalline layer 14 is preferably 0.1 to 0.3, typically 0.2 microns thick.

As an example, active devices 15, 16 may be fabricated by CMOS conventional techniques to form field oxide layers 54 by oxidizing essentially monocrystalline layer 14 in order to isolate active devices 15, 16 from each other, an interlayer dielectric layer 57 preferably formed from tetraethylortosilicate (TEOS), a source electrode 17, a source region 18, a gate electrode 19 with a gate oxide layer and gate region 19A, a drain electrode 20 and a drain region 21 of an NMOS transistor 15 and complementary drain electrode 23, a drain region 24, a gate electrode 25 with a gate oxide layer and a gate region 25A, a source electrode 26 and a source region 27 of a PMOS transistor 16. For instance, CMOS processing is described in "Intuitive CMOS Electronics", by Thomas M. Frederiksen, McGraw Hill, or "VLSI Technology" by S. M. Sze, McGraw Hill.

Active devices 15, 16 may be included, for example, within driver circuits of an active matrix LCD. The top of the wafer 10 may be provided with an optional passivation layer 22 but the present invention is not limited thereto. The method in accordance with the present invention may also be used without a passivation layer 22 and is capable of working successfully with an uneven top surface of the wafer 10 created by the active devices 15, 16. The optional passivation layer 22 may be a suitable nitride or oxide layer or a PSG (phosphorous silicon glass) layer or similar.

Figure 4:
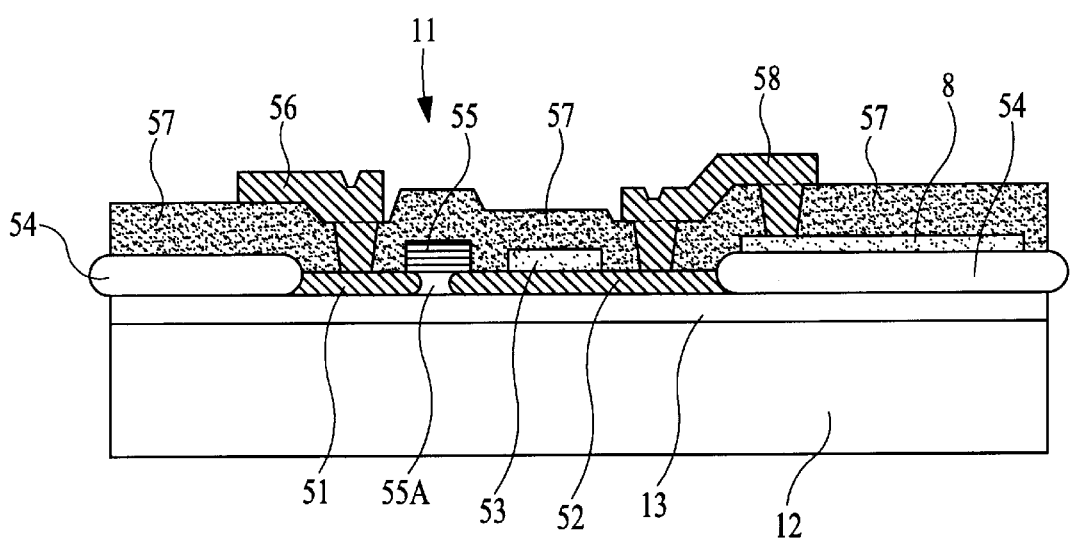
FIG. 4 is a schematic cross-sectional representation of a pixel transistor formed on a thin semiconductor layer in accordance with the present invention.

FIG. 4 is a schematic cross-sectional diagram of a further active device, a thin film (TFT) pixel transistor 11, fabricated in the thin layer 14 of essentially monocrystalline silicon on another part of the silicon wafer 10 described above. Transistor 11 may be formed at the same time as active devices 15, 16 described above. The pixel transistors 11 are isolated from each other by field oxide layers 54 formed out of the monocrystalline silicon layer 14 by oxidation. Drain, source, and gate regions 51, 52, 55A are formed in the silicon layer 14. The transistor select gate 55 is fabricated as well as the one electrode 53 of the capacitor 65 above a thin insulating layer separating the electrode 53 from the other electrode of the capacitor 65 formed in the monocrystalline silicon layer 14. The pixel electrode 8 can be formed on the field oxide 54 at the same time. An interlayer dielectric layer 57 is then formed over the complete device. Insulating layer 57 may be made of tetraethylortosilicate (TEOS). The layer 57 is then covered with a resist layer and via holes opened to the drain and source regions 51 and 52 as well as to the pixel electrode 8. Polysilicon electrodes 56 and 58 as well as the gate connection lines 7 are then formed by depositing polysilicon in an oven followed by patterning a using a resist as a mask. Optionally the polysilicon may be doped during the patterning step to reduce its electrical resistivity. Finally, the metal lines 6 to the source or drain electrodes 56, 58 are formed and each pixel transistor 11 may be shielded from light by an opaque layer 59 which may be a metal layer (best shown in FIG. 10). Optionally, a passivation layer 22 is applied across the complete device.

A first embodiment of a method in accordance with the present invention will be described with reference to FIGS. 5 to 9. The main method steps of the first embodiment of the present invention include forming the field oxide layer 54 followed by patterning thereof, forming an array of individually completed active devices 11, 15, 16, in a thin monocrystalline layer 14 which forms the major surface of a wafer 10, as well as forming capacitors 65, pixel electrodes 8 and the connections 6,7 thereto. Subsequently, the major surface of the wafer 10 is coated with an adhesive layer 28, and the wafer 10 is bonded to a further substrate 30, typically glass. Next, the wafer base layer 12 may be etched or polished to thin this layer 12 to a minimum or to remove it completely, followed by contacting the electrodes 17 of the active devices 15, 16 and optionally exposing the pixel electrodes 8 through the thinned base layer 12 and/or oxide layer 13. Finally, the metal wiring to the drive and logic circuits 3, 4, 5 is fabricated.

After formation of the array of active devices 11, 15, 16, pixel electrodes 8 and connections 6 and 7, etc. in the wafer 10, the completed wafer 10 is preferably cleaned with a suitable cleaning agent such as Microstrip 2001 supplied by OCI Microelectronic Materials, Zwijndrecht, Belgium and then rinsed in de-ionized water. The major surface of the completed wafer 10 having the active devices 11, 15 and 16 is then uniformly coated with an adhesive layer 28. It is preferable if adhesive layer 28 is curable and has a low curing temperature, i.e. less than 200° C. and is solventless. Adhesive layer 28 should preferably be resistant to cleaning, etching and lithography chemicals such as potassium hydroxide solutions, ethylene diamine pyrocatechol, hydrazine, buffered hydrofluoric acid/glycol mixtures, hexamethyl disilane primers supplied by Silicon Resources Inc., Phoenix, USA, resists such as Shipley S1400-37, supplied by Shipley Europe Ltd. Coventry, UK, Microposit Developer 351, also supplied by Shipley Europe Ltd., acetone or isopropyl alcohol. The adhesive layer 28 should also have good adhesion to semiconductor substrates such as gallium arsenide, silicon, silicon oxide, silicon nitride, as well as passivation layers and metals typically used for wiring layers and contacts such as aluminum, gold, titanium or tantalum. Adhesive layer 28 should also adhere well to suitable support substrates such as glass, quartz, ceramics and processed or unprocessed semiconductor substrates such as silicon or gallium arsenide. It is preferable if adhesive layer 28 is very uniform. It is particularly preferred if adhesive layer 28 has a low viscosity so that it is spin coatable. Typical viscosities may lie in the range 500 to 8000 cps, preferably 800 to 4500 cps as measured by the method according to ASTM-D-2393. Spin coating of the curable adhesives mentioned above has been found to give uniform coatings which exhibit local thickness variations for a coating of 20 micron of less than half a wavelength across an area having a diameter of 33 mm when measured in an interferometer at a light wavelength of 633 nm. It is also preferable if the adhesive layer 28 has low shrinkage and low exotherm on curing, preferably nil shrinkage, has no reaction with glass, metals, oxides, nitrides, good resistance to acids and solvents, can be degassed to remove all entrapped air bubbles before spin coating and is highly transparent in the visible light spectrum, e.g. having a transmission of greater than 97% for visible light. In particular, for use in optical devices such as LCD's, a 20 micron thick layer of the adhesive layer 28 when applied to a Pyrex glass plate should have a transmission of better than 90% and preferably 92% or better between the wavelengths of light of 400 and 700 mn. Further, when adhesive layer 28 is in contact with metal electrodes it should be insulating, e.g. a volume resistivity as measured by ASTM-D-257 of greater than $10^{14}$ ohmcm. Adhesive layer 28 should preferably have a low ion content. Suitable materials for adhesive layer 28 may be a two-part heat curable epoxy adhesive such as Stycast 1200J epoxy casting resin with catalyst 100J supplied by Grace N. V., Westerloo, Belgium or R-2615 two-part optically clear potting and encapsulating silicone elastomer supplied by NuSil Technology, Carpintaria, USA. To improve the bond of the silicone elastomer, CFI-135 silicone primer from the same company may be applied to the major surface of the wafer 10 before application of the elastomer. Alternatively, other materials or methods of cross-linking may be used such as UV-cured epoxy adhesives, e.g. cycloaliphatic anhydride epoxy adhesive, for example, EP-112 or EP-30 made by Masterbond Inc. USA.

Prior to application of adhesive layer 28 by spin coating, it is preferred if the adhesive is degassed at reduced pressure, typically less than $10^{-2}$ mbar and preferably less than $10^{-3}$ mbar to remove all air bubbles. Use of a low viscosity adhesive plus cycles of decompression followed by return to atmospheric pressure can speed up this procedure by breaking up any foam formed on the surface of the adhesive layer 28. After degassing, adhesive layer 28 is applied uniformly, e.g. by spin coating, for instance in a conventional resist spin coater such as supplied by Highway Research Inc. USA. The adhesive layer 28 should preferably be thin, e.g. less than 30 micron thick, and may be typically 20 micron thick. Alternative but less preferred application methods are brushing, wiping or dipping.

The substrate 30 may be any suitable support substrate such as glass, ceramic or quartz or another semiconductor substrate such as silicon or gallium arsenide. It is preferred if second substrate 30 is rigid but the invention is not limited thereto. It is further preferred if the thermal expansion coefficient of the substrate 30 matches that of the wafer 10 as closely as possible at least over the temperature range −10° C. to +150° C. For use with optical devices such as CCD or LCD panels, substrate 30 is preferably a flat glass plate such as Pyrex glass Corning 7740 supplied by Corning, France and preferably having a thickness in the range 0.5 to 1 mm. Alternatively, quartz glass may be used. Typically the substrate 30 will be substantially the same size as wafer 10. In accordance with the present invention, second substrate 30 may also be a further semiconductor substrate, including, if required, active circuits or passive devices. Substrate 30 is preferably degreased before bonding, e.g. a Corning 7740 plate may be degreased in a 4:1 solution of sulfuric acid and hydrogen peroxide for 10 minutes followed by rinsing in de-ionized water and drying with a nitrogen gun.

Figure 5:
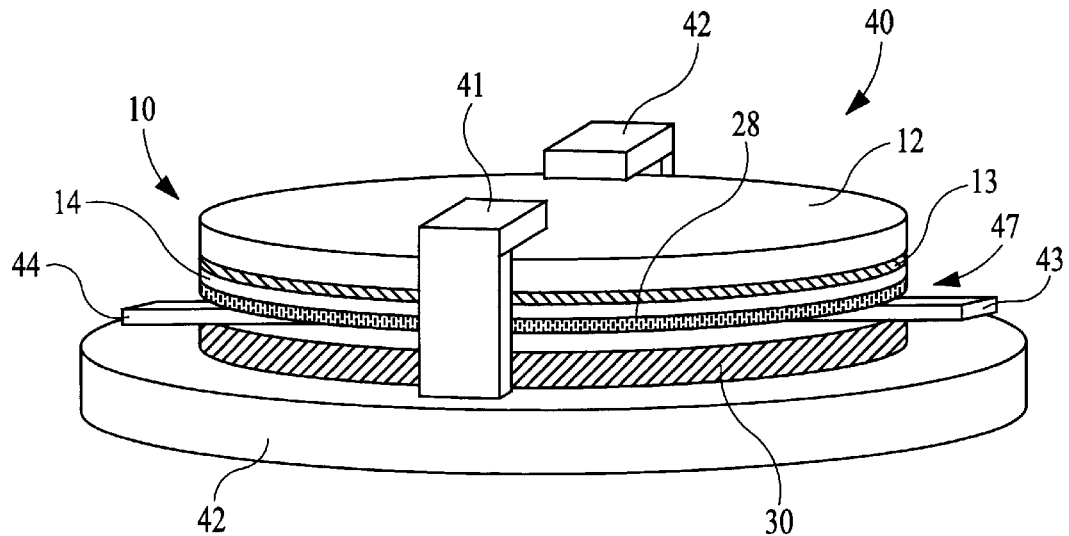
FIG. 5 is a schematic representation of a jig in accordance with the present invention for holding the substrates prior to adhesion bonding.
Figure 6:
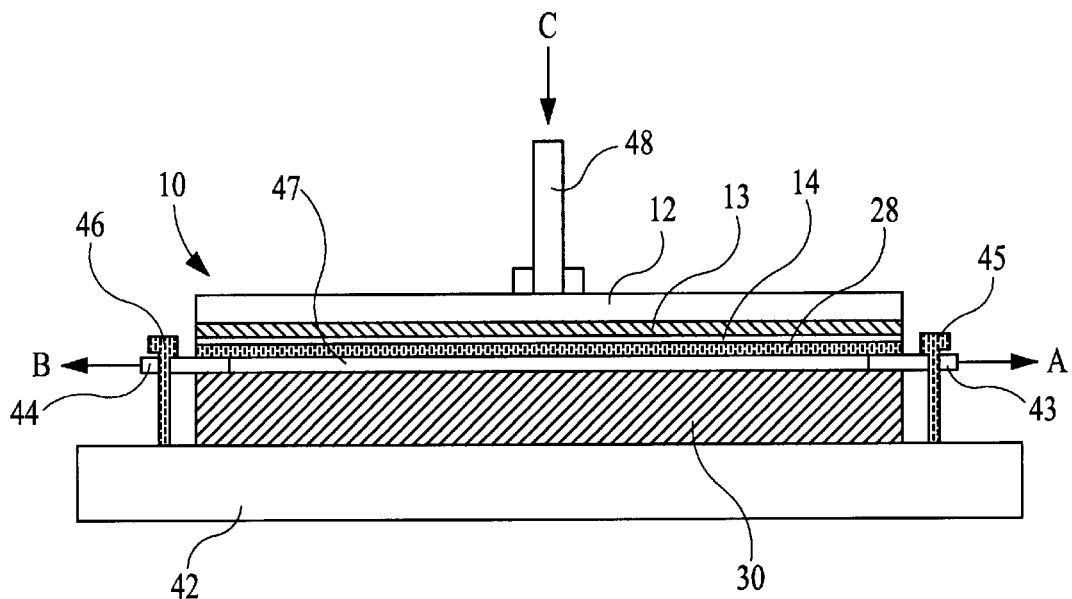
FIG. 6 is a further schematic representation of the jig in accordance with FIG. 5.

Next, coated wafer 10, 28 and substrate 30 are mounted for alignment in a suitable jig 40 as shown schematically in FIG. 5. Whichever is the least flexible of the substrates 10, 30 may be placed on the base support 42 and fixed there by a vacuum clamp or similar. The other of the substrates 30, 10 is then located above the lower substrate 10, 30 and spaced therefrom by a gap 47 of 20 to 100 micron, preferably 30 to 50 micron. To maintain the gap 47 a plurality of appropriately dimensioned spacers 43, 44 may be used. The spacers 43, 44 may be made of metal. For a 150 mm diameter wafer 10, the gap 47 represents typically between 2/15000 and 1/1500 of the diameter of the wafer 10. The spacers 43, 44 are controllably moveable by actuators 45, 46 (best shown in FIG. 6) which hold the spacers and can pull out the spacers 43, 44 in the directions A, B respectively. Substrates 10, 30 may be clamped by a clamping mechanism 41, 42. It is preferable if jig 40 may be located in an aligner (not shown) such as the Electronic Vision Aligner AL6-2 supplied by Electronic Vision of Austria. Using the aligner, the wafer 10 can be accurately aligned with substrate 30. When substrate 30 is a simple glass plate the alignment is relatively uncritical. However, when substrate 30 is another semiconductor substrate with active devices, the alignment may be critical. Conventional methods are available for alignment and micro-positioning of substrates 10, 30 relative to each other to a lateral tolerance of less than 3 micron. Once the correct alignment has been obtained the clamps 41, 42 are applied.

Once substrates 10 and 30 are clamped in the correct relative position, the complete jig 40 is transferred to a vacuum chamber (not shown) and vacuum is applied. Preferably a pressure less than $10^{-5}$ mbar is achieved. Then mechanical pressure is applied to the center of wafer 10 by means of a suitable pin or rod or bar 48 or other means (as best shown in FIG. 5) in the direction "C" in order to deflect the center of the wafer 10 and adhesive layer 28 towards the substrate 30 so that substrate 30 contacts adhesive layer 28. The deflection is approximately the same as the width of the gap, namely 20 to 100 micron or preferably 30 to 50 micron. This represents between 2/15000 and 1/1500 of the diameter of the wafer 10 which is a sufficiently small displacement that the active devices 11, 15, 16 on wafer 10 are not seriously damaged or altered in their electrical properties. Then spacers 43, 44 are removed rapidly by activating the actuators 45, 46 to pull out the spacers 43, 44 in the directions A and B respectively. The wafer 10 then flattens itself against the substrate 30 as the bending moments in the deflected wafer 10 relax. The wafer 10 applies the adhesive layer 28 to the substrate 30 starting substantially at the center and moving out to the edges in a smooth action thus removing any air trapped in the gap 47. Optionally, uniform pressure may be applied afterwards to the wafer/adhesive/substrate composite 10, 28, 30 in order to firmly press the adhesive layer 28 against substrate 30.

Figure 7:
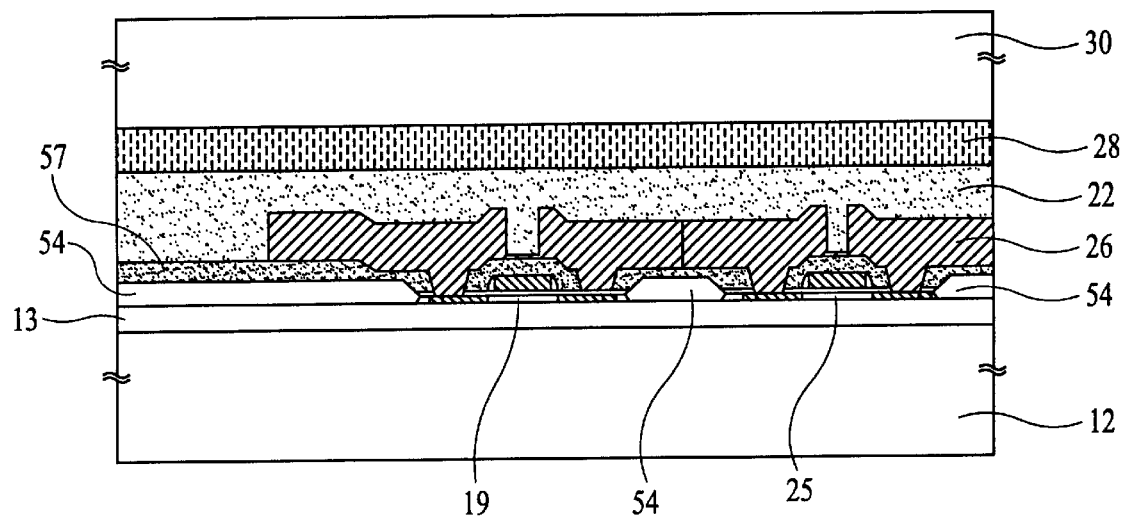
FIGS. 7 to 9 are schematic cross-sectional representations of further manufacturing steps in accordance with the present invention.

The composite 10, 28, 30 is then brought back to atmospheric pressure and the adhesive layer 28 cured by appropriate means, e.g. using adhesive Stycast 1200J and catalyst 100J, by curing at a temperature of 120° C. in a hot air oven for 22 hours. Whichever curing method is used it is preferably below 200° C., more preferably below 150° C. The composite 10, 28, 30 now appears as shown in FIG. 7.

Figure 8:
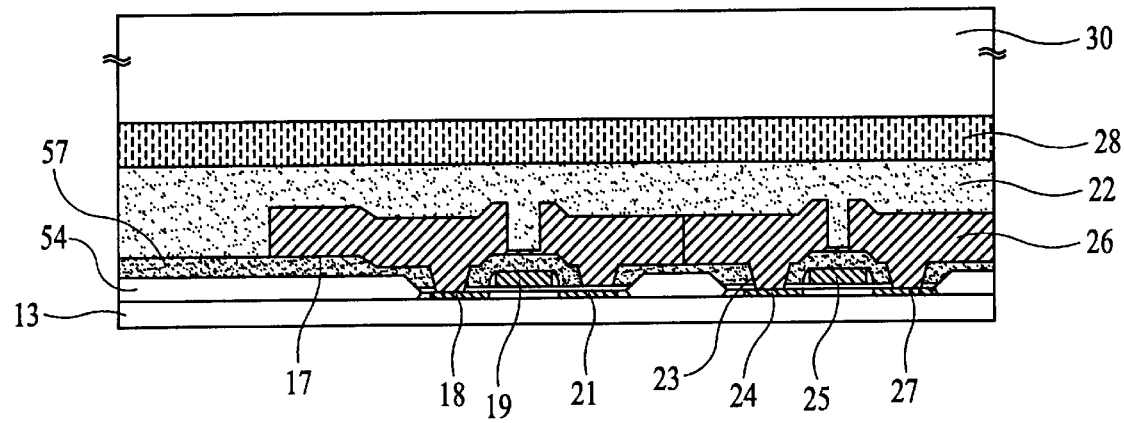

The optical properties at visible wavelengths of the composite 10, 28, 30 are still poor because of the thick base layer 12 of wafer 10. In the next step the base layer 12 is thinned or removed entirely as best shown in FIG. 8. The base layer 12 may be thinned by mechanical thinning, chemical mechanical polishing or by etching, e.g. wet or dry etch including plasma etching or any other similar method. In accordance with the present invention, chemical etching is preferred as mechanical thinning methods tend to introduce strain in the monocrystalline layer 14. Any such strain may not be releasable by annealing as the difference in thermal expansion between the substrate 30 and the monocrystalline layer 14, alternatively, between the adhesive layer 28 and the monocrystalline layer 14 could introduce further strain effects at the annealing temperature. It is preferred in accordance with the present invention if the thinning step is carried out stress-free, e.g. chemical etching at temperatures below 150° C., preferably below 100° C. Further, it is preferred if the material of the second substrate 30 and/or of the adhesive layer 28 (when cured) is not etched or is etched at a considerably slower rate than the base layer 12 of the first substrate 10. If this is the case, there is no need to particularly shield or mask the second substrate 30 and the adhesive layer 28 from the etching solutions for base layer 12. For a silicon wafer 10, the base layer 12 may be etched initially in 35% potassium hydroxide solution at 80° C. to etch the first 90% of the base layer 12. The etch is preferably performed in a wet bench where a reflow of the vapor is enabled. After rinsing in deionized water, the composite 10, 28, 30 is further etched in an ethylene diamine pyrocatecol (EDP) solution. EDP solution is particularly preferred for its selectivity towards oxide so that the etch is stopped on the oxide film 13. The quality of the composite 10, 28, 30 after etching depends upon the quality of the adhesive layer 28 and the bond to both the wafer 10 and the substrate 30. Any air bubbles at the interface of the adhesive layer 28 with the wafer 10 will tend to expand as the wafer 10 is reduced in thickness. This expansion deforms the remaining thin and monocrystalline layers 13, 14 of wafer 10 and the air bubbles may even burst through.

Figure 9:
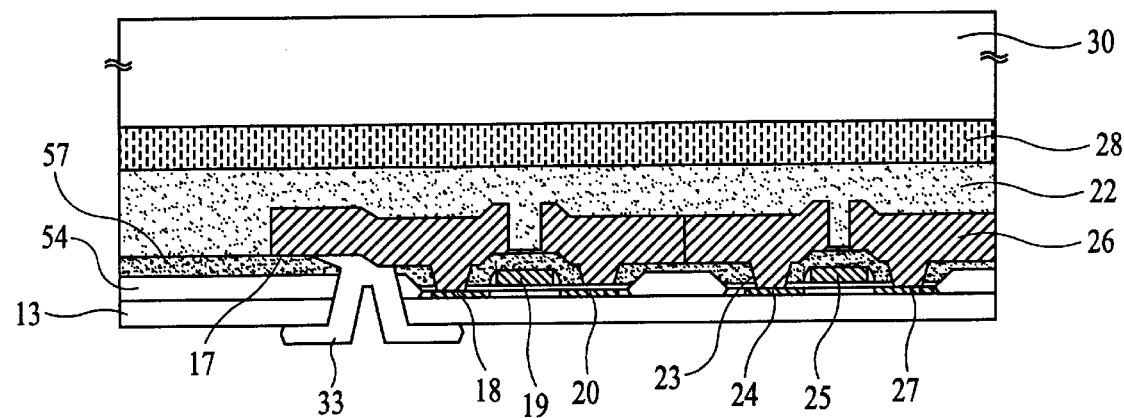

The contact pads of the active devices 15, 16, e.g. electrode 17, on the thin silicon film 14 may be contacted through the oxide layer 13. First a resist layer is patterned on the exposed oxide layer surface using contact printing or similar techniques. The oxide layer 13 is then etched selectively to the metal of the contact pads of the electrodes such as 17, e.g. with a buffered hydrofluoric acid and glycol solution using the resist as a mask. After removing the resist layer, an additional metal layer or additional metal layers 33 can be deposited and patterned as best shown in FIG. 9 so that the driver circuits may be contacted. The additional metal layer 33 may be aluminum which is patterned using resist as a mask and then wet etched.

Optionally, the pixel electrodes 8 may be exposed by selectively etching the oxide layer 13 and the field oxide layer 54 (best shown in FIG. 10) either by a wet or dry etch using resist as a mask. The etching procedure should be highly selective for the oxide layers 13 and 54 over the polysilicon electrode 8. The oxide layer 13 and the field oxide 54 may be etched down to the pixel electrode 8 using reactive plasma etching in an atmosphere of hydrogen and $CF_4$ which may provide a selectivity of $SiO_2$ to silicon of 20:1. Finally, an alignment film or orientation layer 67 (best shown in FIG. 10) may be coated onto the oxide layer 13, baked and then rubbed as is known to the skilled person. Where the pixel electrodes 8 have been exposed through the oxide layer 13, it is preferred if the alignment layer 67 planarises the surface of oxide layer 3.

Figure 10:
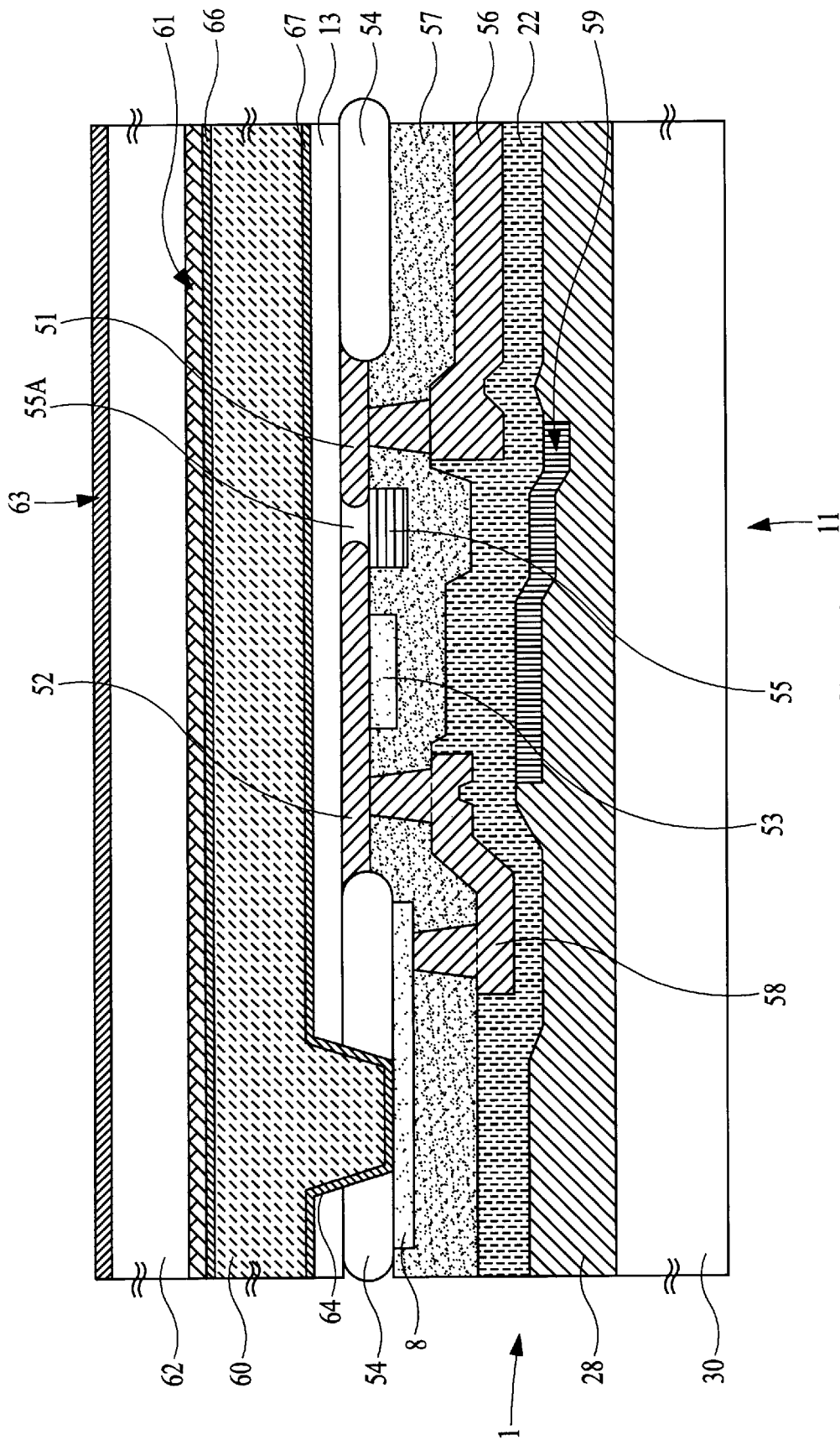
FIG. 10 is a schematic cross-sectional representation of an LCD display using the circuit panel in accordance with the present invention.

The circuit panel 1 in accordance with the present invention produced by the method described above may be formed into a transmissive LCD as shown schematically in cross-section in FIG. 10. Reference numbers in FIG. 10 which are the same as in FIGS. 1 to 9 refer to the same components as in those figures and are manufactured by the same methods as described above. The panel 11 is formed from the transistors 11, 15, 16 (only a pixel transistor 11 is shown) which are supported by the glass substrate 30 to which they are bonded by the bonding method of the invention described above using a cured adhesive layer 28, the outer surface of the transistors 11, 15, 16 being covered by the oxide layer 13 on one side and being covered by an optional passivation layer 22 on the other side. Transistor 11 may be shielded from light by an opaque layer 59. Polysilicon gate and drain electrodes 55, 58 are connected to connections 7 and 6 respectively, and via these to the active devices 15, 16 of the peripheral drive circuits 4 and 5. A light source is provided (not shown) to shine light uniformly through the LCD display from the side adjacent to the glass substrate 30 so that the optically transparent substrate 30 is positioned between the circuit panel 1 and the light incident from the light source.

The exposed surface of circuit panel 1 which is remote from the glass substrate 30 is contacted to liquid crystal material 60. The liquid crystal material 60 may be any suitable liquid crystal material such as a twisted nematic. The liquid crystal material 60 may be immediately adjacent to (separated by the oxide layer 13), or in contact with the pixel electrode 8 or an alignment film or orientation layer 67 preferably made from polyimide material on the pixel electrode 8 through a hole 64 etched in the oxide layer 13 and the field oxide 54. The hole 64 may expose a substantial area of the pixel electrode 8. The exposed area of the pixel electrode is bounded by the oxide layer 13. The other side of the liquid crystal material 60 is bounded by a transparent electrode 61 which is typically made from ITO which is attached to a further glass plate 62. ITO electrode 61 may be covered by a further alignment layer or orientation layer 66 facing towards the liquid crystal material 60. Alignment film 66 may also be made of polyimide material. The LCD is completed with a polarizer 63. If a color LCD is to be produced, colored filters may be added as known to the skilled person.

The above described embodiment of the invention is capable of bonding a silicon wafer of 200 mm diameter to a Pyrex glass plate and to maintain the electrical properties of PMOS transistors 16 so that compared to the same transistors before the processing, the change in absolute value of the threshold voltage of these transistors as achieved in accordance with the present invention is less than 400 mV, preferably less than 300 mV and more preferably less than 200 mV. For NMOS transistors 15 the change in threshold voltage using the method in accordance with the present invention is less than 100 mV, preferably less than 60 mV, more preferably 40 mV or less.

In the above embodiment adhesive layer 28 was applied to the wafer 10. The present invention is not limited thereto. The adhesive layer 28 may be alternatively applied to the substrate 30. Further, the order of the substrates shown in FIG. 4 may be reversed so that the substrate 10 may be placed on the base plate 42. Additionally, both substrates 10 and 30 may be semiconductor substrates, each of which may contain active devices 11, 15, 16, e.g. thin film transistors (TFT) or similar.

Preferred embodiments of the present invention have been illustrated and described. It will be understood, however, that changes and modifications may be made to the invention without deviating from the spirit and scope of the invention, as defined by the following claims.

What we claim is:

1. A method of bonding a first semiconductor substrate to a second substrate, comprising the steps of:

forming active devices on a first major surface of said first substrate, coating an adhesive onto said first major surface of said first substrate;

aligning said first and second substrates so that said coated first major surface of said first substrate is facing said second substrate and is separated therefrom by a gap;

deflecting at least one of said first and second substrates by exerting a pressure between said first and second substrates substantially at the center thereof so that the adhesive coating substantially at the center of said first substrate comes into contact with said second substrate; and allowing the remaining parts of said coated first major surface of said first substrate to come into contact with said second substrate.

2. The bonding method according to claim 1, further comprising the step of evacuating the gap between said adhesive coated first substrate and said second substrate before said deflecting step.

3. The bonding method according to claim 1, further including the step of degassing said adhesive under reduced pressure before said coating step.

4. The bonding method according to claim 1, further comprising the step of curing said adhesive coating at a temperature below 200° C., more preferably below 150° C., after said allowing step.

5. The bonding method according to claim 1, wherein at least one of said substrates includes a thin layer of essentially monocrystalline silicon.

6. The bonding method according to claim 1, further including the step of reducing the thickness of at least one of said first substrate and said second substrate after said allowing step.

7. The bonding method according to claim 1, further comprising the step of reducing the thickness of the other major surface of said first substrate after said allowing step.

8. The bonding method according to claim 6, wherein said thickness reducing step includes at least one of chemical etching, chemical mechanical polishing, mechanical thinning, cleaving and plasma etching.

9. The bonding method according to claim 6, wherein said thickness reducing step is a chemical etching step at a temperature of less than 150° C., preferably less than 100° C.

10. The bonding method according to claim 7, wherein said active devices forming step includes forming a fixed array of transistors in a layer of essentially monocrystalline silicon on said first surface of said first substrate.

11. A method of fabricating a circuit panel for a liquid crystal display comprising the steps of:

forming a first composite from a layer of essentially monocrystalline silicon material on an insulating layer, the insulating layer being over a first substrate;

forming an array of transistors in or on the layer of essentially monocrystalline silicon and forming pixel electrodes such that each pixel electrode is actuatable by at least one transistor of said array;

bonding the major surface of said first composite remote from said first substrate to a second substrate to form a second composite including at least said first substrate, said insulating layer, said essentially monocrystalline silicon and said second substrate, said bonding step comprising:

coating an adhesive onto the first major surface of said first composite;

aligning said first composite and said second substrate so that said coated first major surface of said first composite is facing said second substrate and separated therefrom by a gap;

deflecting at least one of said first composite and said second substrate by exerting a pressure between said first composite and said second substrate substantially at the center thereof so that the adhesive coating substantially at the center of said first composite comes into contact with said second substrate; and allowing the remaining parts of said coated first major surface of said first composite to come into contact with said second substrate to form said second composite.

12. The method according to claim 11, further comprising reducing the thickness of said first substrate after said allowing step.

13. The method according to claim 11, further comprising the step of evacuating the gap between said adhesive coated first composite and said second substrate before said deflecting step.

14. The method according to claim 11, further including the step of degassing said adhesive under reduced pressure before said coating step.

15. The method according to claim 11, further comprising the step of curing said adhesive coating at a temperature below 200° C., more preferably below 150° C., after said allowing step.

16. The method according to claim 12, wherein said thickness reducing step includes at least one of chemical etching, chemical mechanical polishing, mechanical thinning, plasma etching and cleaving.

17. The method according to claim 12, wherein said thickness reducing step is a chemical etching step at a temperature of less than 150° C., preferably less than 100° C.

18. The method according to claim 12, further comprising selectively etching through said insulating layer to expose an area of at least one said pixel electrode bounded by said insulating layer;

positioning a liquid crystal material adjacent said exposed area of said at least one pixel electrode such that an electric field generated at said at least one pixel electrode alters a light transmitting property of said liquid crystal material.

19. The method according to claim 18, wherein the step of selectively etching through said insulating layer includes reactive ion plasma etching.

* * * * *